(12) United States Patent
McCallum

(10) Patent No.: US 6,815,845 B1
(45) Date of Patent: Nov. 9, 2004

(54) METHOD AND APPARATUS FOR REVERSING POLARITY OF A HIGH VOLTAGE POWER SOURCE

(75) Inventor: Jeffrey David McCallum, Cayucos, CA (US)

(73) Assignee: Rantec Power Systems Inc., Los Osos, CA (US)

( * ) Notice: Subject to any disclaimer, the term of this patent is extended or adjusted under 35 U.S.C. 154(b) by 320 days.

(21) Appl. No.: 10/124,468

(22) Filed: Apr. 17, 2002

(51) Int. Cl.[7] .................................................. H02B 1/24
(52) U.S. Cl. ........................................ 307/127; 361/84
(58) Field of Search .......................... 307/127; 320/165, 320/DIG. 15; 361/76, 77, 82, 84

(56) References Cited

U.S. PATENT DOCUMENTS

| | | | |
|---|---|---|---|
| 4,423,456 A | * 12/1983 | Zaidenweber | 361/77 |
| 4,473,757 A | * 9/1984 | Farago et al. | 307/127 |
| 4,689,711 A | * 8/1987 | Conzelmann et al. | 361/91.6 |
| 5,495,155 A | 2/1996 | Juzswik et al. | 318/293 |
| 6,008,549 A | 12/1999 | Cooper et al. | 307/125 |
| 6,046,551 A | * 4/2000 | Kita | 315/307 |
| 6,090,153 A | 7/2000 | Chen et al. | 716/8 |
| 6,175,765 B1 | * 1/2001 | Sullivan et al. | 607/5 |
| 6,288,603 B1 | 9/2001 | Zanuccoli et al. | 327/544 |

* cited by examiner

*Primary Examiner*—Gregory J. Toatley, Jr.
(74) *Attorney, Agent, or Firm*—Hickman Palermo Truong & Becker LLP

(57) ABSTRACT

The present invention is directed to a circuit for reversing the polarity of a high voltage power supply. Circuits according to embodiments of the invention may include four switches, one or more of which may be solid-state switches. The solid-state switches may include a transistor stack that is supplied a biasing voltage in response to the receipt or removal of a control signal. When the biasing voltage is supplied to one transistor in the stack to change it to the closed or "ON" state, the other transistors in the stack may also be changed to the closed state in a cascading process. The control signal may be a low voltage signal and may be isolated from the solid-state switch by a control switch, which may be an optocoupler. The four switches may be connected so that two switches selectively connects a first input terminal from the high voltage source to the first and second output terminals, while two other switches selectively connect the second input terminal from the high voltage source to the first and second output terminals. Accordingly, by switching one pair of switches or the other pair of switches to the closed position, the polarity of the high voltage source may be inverted at the output terminals.

60 Claims, 2 Drawing Sheets

METHOD AND APPARATUS FOR REVERSING POLARITY OF A HIGH VOLTAGE POWER SOURCE

BACKGROUND

In many electronic applications, it is desirable to reliably reverse the polarity of a high voltage power supply using a low voltage control signal. However, current systems for accomplishing this objective generally involve the use of resonant circuit components, such as transformers, or other elements that introduce unacceptable delays between receipt of the control input and the effect on the controlled output, preventing fast polarity switching. Additionally, these techniques require considerable complexity to control the individual switch elements. Other presently available systems use multiple high voltage sources that are switched in or out via the use of electromechanical relays. While this method is functional, relays are known to impair system reliability.

In the context of an external defibrillator, U.S. Pat. No. 6,175,765 to Sullivan et al. ("Sullivan et al. reference") discloses a four-leg H-bridge output circuit that includes a solid-state switch in each leg. By selectively switching on pairs of switches in the H-bridge output circuit, a biphasic defibrillation pulse may be applied to the patient. However, the Sullivan et al. reference teaches that the switches are preferably three silicon-controlled rectifiers (SCRs) and a switch comprised of two insulated gate bipolar transistors (IGBTs). Both types of switches are driven by "an oscillating control signal, preferably a pulse train" that must be continuously applied in order to maintain the switch in the "ON" position. The drive circuits for both types of switches involve resonating elements (e.g., transformers) that will introduce switching delays. Furthermore, the control signal for the IGBT pair must be significantly amplified by its drive circuit in order to change the IGBT pair to the "ON" state. The Sullivan et al. reference acknowledges that "the maximum working voltage of presently available IGBTs is not sufficient to withstand the maximum voltage that may occur across switch SW2." It attempts to solve this problem by connecting two IGBTs in series so that the voltage is split therebetween. Accordingly, the Sullivan et al. reference describes a polarity-reversing circuit that requires complex switch-driving circuit with independent switch-driving sub-circuits for each IGBT. The disclosed circuit is, therefore, an expensive way to adapt polarity reversing circuits for use in high-voltage applications. Moreover, the use of SCRs in the bridge network is not practical for low power applications. SCRs require a minimum amount of current (holding current) to flow through them in order for the junction to remain open. In low power applications, the load current could easily fall below the holding current required by the SCR and the switch would no longer be operational. Moreover, as acknowledged in the Sullivan et al. reference, systems used to reverse the polarity of low voltage power sources generally cannot be adapted for use with high voltage power supplies. Adapting polarity-switching circuits intended for low-voltage applications for use in high-voltage applications often involves the substitution of larger, heavier, costlier and/or less efficient electrical components.

U.S. Pat. No. 6,046,551 to Kita ("Kita reference") is directed to a device for controlling the supply of high voltage (400 V) power to an igniter circuit for a discharge lamp. The control device includes an H bridge having two pairs of transistors for applying a high AC voltage to the igniter circuit when a DC input is received. The Kita reference requires that the first pair of transistors must have a higher withstand voltage than the second pair of transistors. The Kita reference describes a CPU as creating a bridge control signal for turning on one or the other pair of transistors. Based on FIG. 1 of the Kita reference, the control signal must be sufficient to forward-bias the junction between the drain terminal (which may be coupled to a high voltage line) and the gate terminal. Accordingly, the circuit disclosed in the Kita reference requires that high-voltage control signals be applied to effect polarity reversal. Furthermore, these control signals are not isolated from the remainder of the H bridge.

Accordingly, there is a need for a polarity-reversing circuit adapted for use with a single high voltage power source that can transition from one polarity to the other without introducing significant time delays between application of a control signal and the changing of switch states to effect the reversal. Moreover, there is a need for a polarity-reversing circuit for use with a high-voltage power source that can be controlled by applying a low voltage signal. There is also a need for a polarity reversing circuit that can be configured to reduce ripple (noise) on the output caused by a high voltage switching power supply.

DETAILED DESCRIPTION

Embodiments of the present invention are generally directed to a network of solid state switches for rapidly and reliably reversing the polarity of a high voltage DC power supply. The polarity reversing circuit may use a low voltage, ground-referenced control signal to operate switch elements in order to change the polarity of the output voltage. According to embodiments of the invention, four solid state switches may be configured in an "H" bridge to reverse the polarity of the high voltage power source. Additionally, the ripple rejection of the solid-state switch or switch network can be greatly improved by operating at least one transistor stage in the solid-state switch in linear mode.

Figure 1:
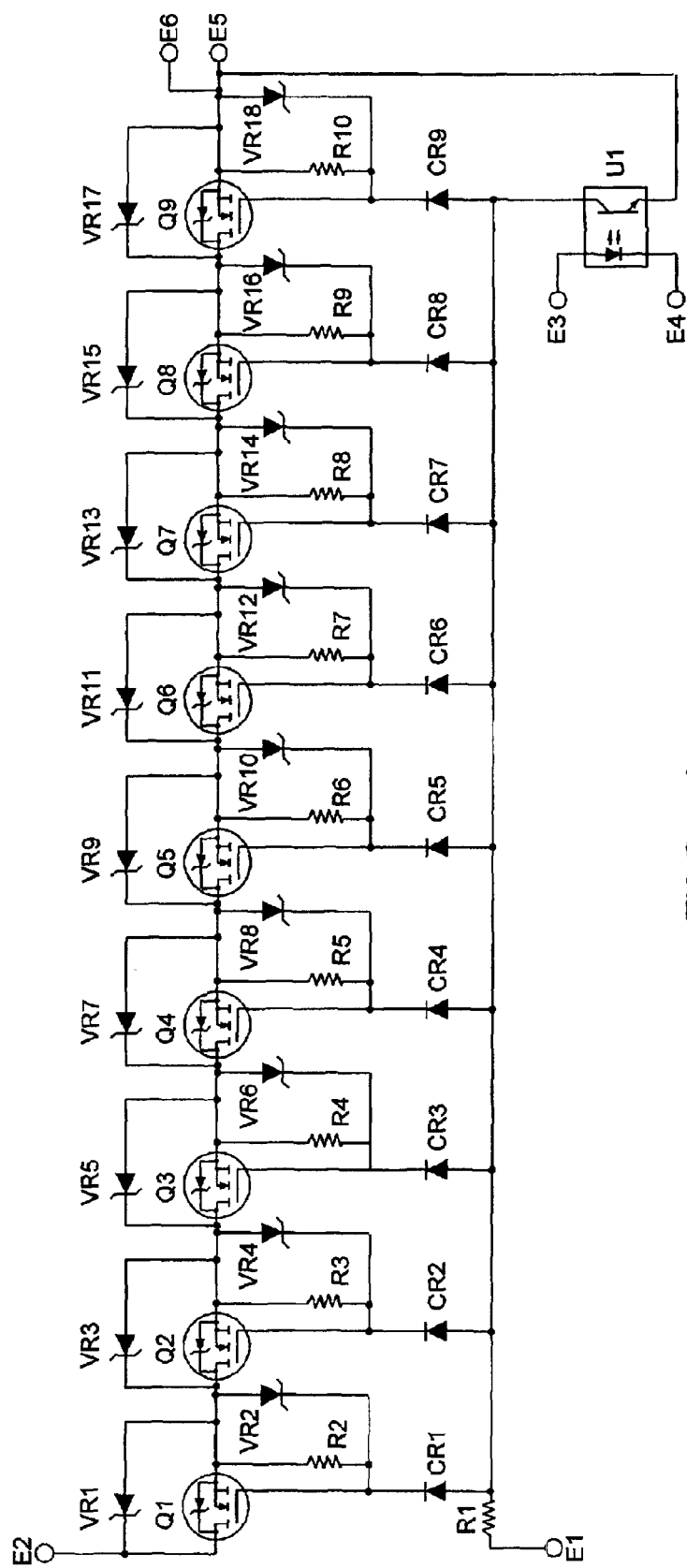
FIG. 1 is a circuit schematic diagram depicting a solid state high voltage switch according to an embodiment of the present invention.

FIG. 1 depicts an isolated high voltage MOSFET transistor stack that may be used as a solid-state switch according to embodiments of the present invention. In the particular embodiment shown, the transistor stack consists of nine stages, each including a transistor Q1 to Q9. While a MOSFET transistor is preferred for a switching element, other types of FETs or other transistors may be substituted. The number of transistor stages may be increased or decreased depending on the maximum input voltage the solid-state switch will receive. The high voltage conduction path of the switch is from a high voltage input terminal E2 to an output terminal E6 when the switch is in the closed mode. In the open mode, the switch will block transmission of a positive (as measured from terminal E2 to E6) voltage from the high voltage input terminal E2 to the output terminal E6. An isolated bias voltage may be connected between bias terminal E1 and bias terminal E5. Bias terminal E5 may be coupled to the output terminal E6. Voltage regulators VR1, VR3, VR5, VR7, VR9, VR11, VR13, VR15 and VR17 (shown as zener diodes) may be provided to prevent damage to a transistor from the application of an excessive voltage across its drain and source terminals.

The switch may be operated by supplying a biasing voltage at a bias terminal E1 relative to bias terminal E5 of a magnitude great enough to fully enhance the gate of transistor Q9 such that current is allowed to flow from the drain terminal to the source terminal of the transistor. In alternative embodiments in which bipolar junction transistors (BJTs) are used, a current is supplied to the base terminal of the BJT to induce current flow between a collector terminal and an emitter terminal. Current regulating elements CR1 to CR9 (shown as diodes in FIG. 1) may used to prevent current flowing into the biasing stage when transistors Q1 to Q9 are open.

In embodiments of the invention, the control switch U1 may be an optocoupler that includes a photodiode and a phototransistor, as shown in FIG. 1. While an optocoupler is advantageous because it provides for isolation of the control signal from the phototransistor and the remainder of the circuit, other types of switches may be used. The biasing voltage may be applied at the bias terminal E1 relative to bias terminal E5 and a control signal drives current into control terminal E3 and through the photodiode to return through control terminal E4. As a result, the photodiode may transmit light to the phototransistor, maintaining the control switch U1 in a saturated state, i.e., the control switch is in the open or "OFF" state. When the current driven through the photodiode by the control signal is removed, the phototransistor will turn to the open or "OFF" state. In alternative embodiments of the invention, the control switch U1 may be configured so that the open or "OFF" state is achieved when a "high" control signal is applied and the closed or "ON" state is achieved when no or a "low" control signal is applied. Alternatively, in embodiments of the invention, control switch U1 may be removed and the state of the solid-state switch may be controlled by directly turning on or off the biasing voltage connected between bias terminal El and bias terminal E5.

In alternative embodiments of the invention, other mechanisms may be used as the control switch U1, such as electrical coupling elements (e.g., a diode and transistor), switches, rectifiers, relays, resonant circuit elements (e.g., transformers), or the like. However, it may be advantageous to use an optocoupler as the control switch U1 in applications where isolation of the control signal from the controlled load and fast response to changes in the control signal are desirable. It should be further understood that while use of an optocoupler including a phototransistor is shown in FIG. 1, different types of optocouplers, such as those including phototriacs, photodarlingtons or light-activated rectifiers, may also be used.

In the embodiment shown in FIG. 1, with the control switch U1 in saturation (i.e., in the closed or "ON" state), the gate-source voltage of transistor Q9 will be insufficient to bring the transistor Q9 into enhancement mode. Current from the biasing terminal E1 will be drained off to bias terminal E5 (which may be electrically coupled to the output terminal E6) rather than passing through the drain path resistor R10. Therefore, the solid-state switch will remain in the "open" state. The solid-state switch may then be "closed" by removing the control signal from (or applying a "low" control signal to) the control switch U1, thereby opening the control switch U1. Opening the control switch allows the gate of transistor Q9 to become enhanced by the biasing voltage and thereby reduces the drain source impedance of Q9 to effectively a short. Where transistor Q9 is a FET, the transistor Q9 may include an inherent capacitance between the gate and source terminals, and enhancement may occur when the biasing voltage is applied to the gate terminal. In alternative embodiments, such as those in which a BJT is used for transistor Q9, a biasing element may be connected between terminals of the BJT to forward bias the base-emitter junction. The impedance of Q9 transitions from high to low, allowing current to flow from the bias terminal E1, through drain path resistor R9 and transistor Q9 to the output terminal E6. As a result, the biasing voltage may be applied to the gate terminal of transistor Q8 and transistor Q8 may also become enhanced. This cascading process continues up the stack until all of the transistor elements Q1 to Q9 are fully enhanced, at which time the solid-state switch is considered closed. Voltage-regulating Zener diodes VR2, VR4, VR6, VR8, VR10, VR12, VR14, VR16 and VR18 may be chosen so that their "breakdown" voltage is less than the maximum voltage difference permissible between the gate and source terminals at which transistors Q1 through Q9 can operate.

Where transistors Q1 to Q9 are FETs, drain path resistors R2 to R10 may be coupled across the gate and source terminals of the transistors Q1 to Q9 as shown in FIG. 1. When the solid-state switch transitions from the closed state to the open state, charge built up at the gate terminal of each FET may be drained to prevent the stage from closing again until the biasing voltage is reapplied. Thus, during this transition, charge from the gate terminal of each transistor Q1 to Q9 may be drained away as current passing through the drain path resistors R2 to R10 to the output terminal E6, since current may be prevented from draining through the current-regulating diodes CR1 to CR9. As previously discussed, in alternative embodiments in which the transistors Q1 to Q9 are BJTs, resistors may be coupled across the terminals of the transistors Q1 to Q9 to act as biasing elements. Furthermore, in alternative embodiments of the invention, the transistors Q1 to Q9 and control switch U1 may be configured such that the transistors Q1 to Q9 transition to the closed state when the control switch U1 closes.

Figure 2:
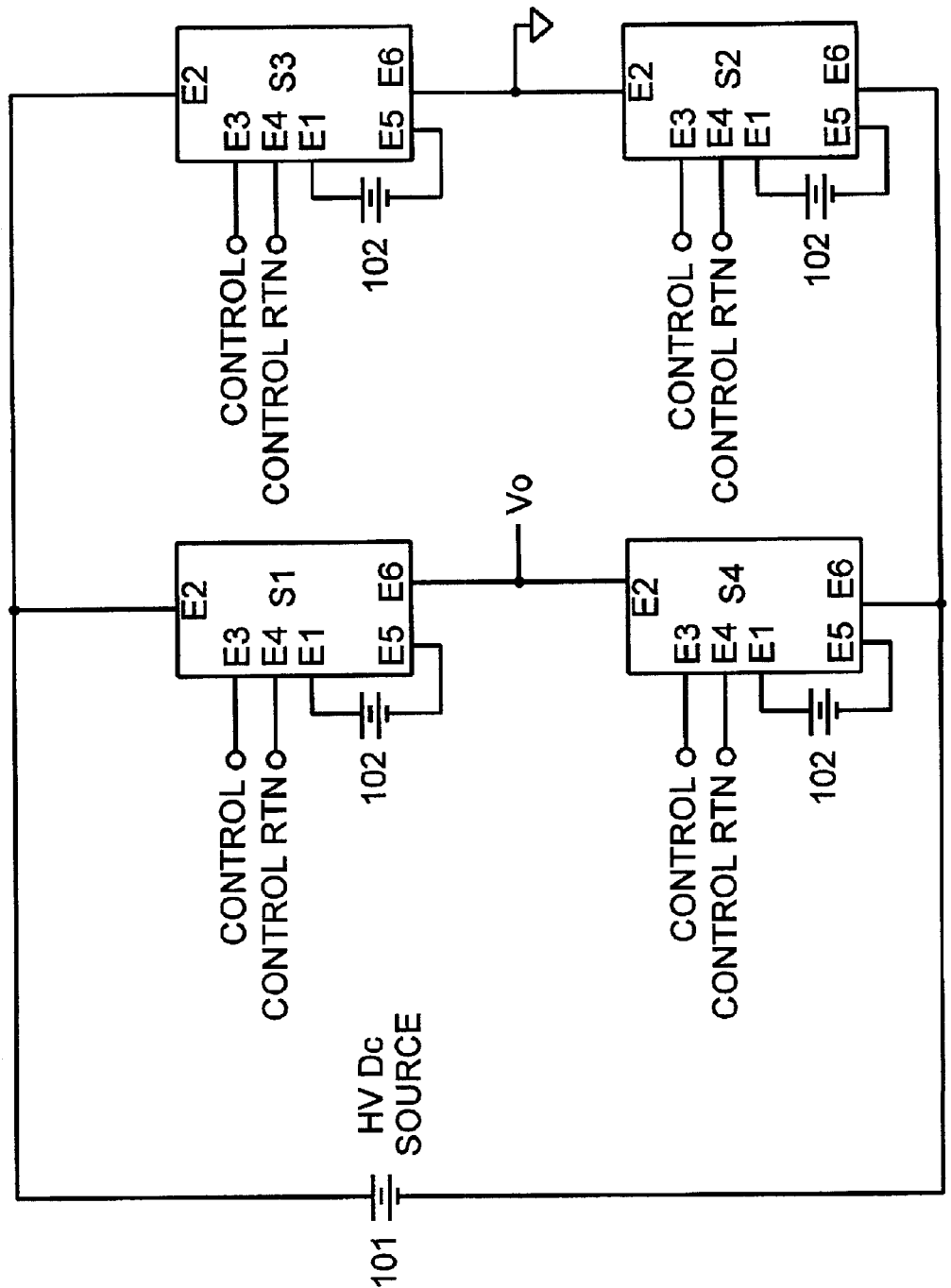
FIG. 2 is a circuit schematic diagram depicting an polarity reversing switch network according to an embodiment of the invention.

FIG. 2 depicts the switch arrangement for a network for reversing the polarity of a high voltage source according to an embodiment of the invention. In the embodiment shown, the network includes four switches S1, S2, S3 and S4, each of which may be solid state high voltage switches of the type illustrated in FIG. 1. In the embodiment shown, each of the switches has a voltage input terminal (E2), a voltage output terminal (E6), and bias terminals (E1 and E5) across which a fixed biasing voltage source 102 may be connected, and control terminals (E3 and E4) through which the control signal for the switch is provided. A high voltage source 101 may be connected to the network so that its positive terminal is connected to the input voltage terminals of switches S1 and S3 and its negative terminal is connected to the output terminals of switches S2 and S4. A first output voltage terminal (labeled "Vo" in FIG. 2) is connected to the output terminal E6 of switch S1 and the input terminal E2 of switch S4. The input terminal E2 of switch S2 and the output terminal of switch S3 are connected to a second output voltage terminal (shown as connected to ground in FIG. 2). Although the second output terminal need not be coupled to ground, this is generally desirable in high voltage applications. Accordingly, in the following discussion, the second output terminal is referred to as ground.

For the output voltage to have a positive polarity relative to ground, switches S1 and S2 may be closed and switches S3 and S4 should remain open. In this configuration, the positive terminal of the high voltage source 101 is connected through S1 to the output and the negative terminal of the high voltage source 101 is connected to ground through S2.

In order to reverse the polarity, switches S1 and S2 may be opened and switches S3 and S4 may be closed. In order to prevent possible shoot-through current, switches S1 and S2 should first opened and then switches S3 and S4 may then be closed. In this configuration, the positive output of the high voltage source 101 is referenced to ground via switch S3 and the return terminal of the high voltage source 101 is connected to the output lead via switch S4. The network in this manner produces a negative voltage relative to ground.

To simplify the control of the switches S1 through S4, the switches may be of a type similar to that shown in FIG. 1. With the control signal being isolated from the actual switching element by the optocoupler U1, a ground-referenced circuit can be used to implement the control. The biasing voltage source 102 for switch S1 may be isolated from ground. The biasing voltage sources 102 associated with switches S2 and S4 may also be isolated from ground, but are referenced to the same point, so it is possible for switches S2 and S4 to share a common biasing voltage source 102. Since, in the embodiment shown, the output voltage is also referenced to ground, the biasing voltage source for switch S3 need not be isolated.

In embodiments of the invention, a single control signal source may be used to control all four switches or two control signal sources may be used (one for each of switch pairs S1/S2 and S3/S4). In such embodiments, a single control signal may be sent to switches S1 and S2 and the opposite control signal may be sent to switches S3 and S4. The control signal to the S3/S4 switch pair may be produced by passing the control signal to the S1/S2 switch pair through an inverter. In such embodiments, it may be necessary to include delay elements to ensure that a switch pair is opened before the other switch pair is closed.

In applications in which the solid-state switch or switch network is connected to a high voltage source to produce an output voltage with a low noise content, it may be desirable to use an embodiment of the solid-state switch in which at least one transistor Q1 to Q9 operates in linear mode, i.e., making the transistor a linear pass element. By AC coupling the high voltage source directly to the gate terminal of one of the transistors Q1 to Q9, the transistor Q1 to Q9 will operate in a similar manner to a linear pass voltage regulator by blocking the AC components of the high voltage source and passing the DC voltage. This results in a dramatic improvement in ripple rejection from the high voltage power supply and can be accomplished without requiring a large passive filter network. For the polarity reversing switch network shown in FIG. 2, ripple rejection may be improved by having a single linear pass element in either S1 or S2 to block the positive mode ripple and another single linear pass element in S3 or S4 for the negative mode of operation.

While the description above refers to particular embodiments of the present invention, it should be readily apparent to people of ordinary skill in the art that a number of modifications may be made without departing from the spirit thereof. The accompanying claims are intended to cover such modifications as would fall within the true spirit and scope of the invention. The presently disclosed embodiments are, therefore, to be considered in all respects as illustrative and not restrictive, the scope of the invention being indicated by the appended claims rather than the foregoing description. All changes that come within the meaning of and range of equivalency of the claims are intended to be embraced therein.

What is claimed is:

1. A circuit for reversing the polarity of a high voltage power source, said circuit comprising:
   a first input terminal;
   a second input terminal, said high voltage power source being electrically coupled between said first input terminal and said second input terminal;
   a first output terminal;
   a second output terminal;
   a first switch electrically coupled between said first input terminal and said first output terminal, said first switch configured to change from a first state to a second state when a first control signal is received;
   a second switch electrically coupled between said second input terminal and said second output terminal, said second switch configured to change from a first state to a second state when a second control signal is received;
   a third switch electrically coupled between said first input terminal and said second output terminal, said third switch configured to change from a first state to a second state when a third control signal is received;
   a fourth switch electrically coupled between said second input terminal and said first output terminal, said fourth switch configured to change from a first state to a second state when a fourth control signal is received; and
   at least one switch driver configured to provide at least one of said first control signal, said second control signal, said third control signal and said fourth control signal, wherein said provided control signal is a low voltage signal.

2. The circuit of claim 1, wherein at least one of said first switch, said second switch, said third switch and said fourth switch is a solid-state switch that includes a control switch and a plurality of transistors configured such that each of said plurality of transistors changes state when said provided control signal is received.

3. The circuit according to claim 2, wherein said control switch electrically isolates said control signal from the remainder of said solid-state switch.

4. The circuit according to claim 3, wherein said control switch is an optocoupler.

5. The circuit according to claim 2, wherein said control switch includes a transistor.

6. The circuit according to claim 2, wherein said at least one solid-state switch changes from a closed state to an open state when said control signal is received.

7. The circuit according to claim 2, wherein said at least one solid-state switch changes from an open state to a closed state when said control signal is received.

8. The circuit according to claim 2, wherein said solid-state switch further receives a biasing voltage.

9. The circuit according to claim 8, wherein the state of said control switch determines whether said biasing voltage is applied to change the state of one of said plurality of transistors.

10. The circuit according to claim 2, wherein said plurality of transistors are electrically connected such that when the state of a first transistor changes from an open state to a closed state, the state of a second transistor changes from an open state to a closed state.

11. The circuit according to claim 2, wherein said control switch diverts current from an element electrically coupled to a first one of said plurality of transistors when said control switch is in the closed state.

12. The circuit according to claim 11, wherein said element includes a resistor.

13. The circuit according to claim 2, wherein current is prevented from flowing through an element electrically coupled to a second one of said plurality of transistors when said first one of said plurality of transistors is opened.

14. The circuit according to claim 1, wherein said first control signal and said second control signal are identical, and wherein said third control signal and said fourth control signal are identical.

15. The circuit according to claim 1, wherein said first switch and said second switch are in the same state at all times, and wherein said third switch and said fourth switch are in the same state at all times.

16. The circuit according to claim 1, wherein one of said third control signal and said fourth control signal causes one of said third switch and said fourth switch to change from an open state to a closed state after one of said first control signal and said second control signal causes one of said first switch and said second switch to change from a closed state to an open state.

17. The circuit according to claim 1, wherein at least two of said first control signal, said second control signal said third control signal and said fourth control signal are generated by a single switch driver.

18. The circuit according to claim 2, wherein at least one of said plurality of transistors is operated in linear mode.

19. The circuit according to claim 2, wherein at least one of said plurality of transistors is a field effect transistor.

20. The circuit according to claim 19, wherein a drain element is electrically coupled to a gate terminal of said field effect transistor.

21. A circuit for reversing the polarity of a high voltage power source, said circuit comprising:

a first solid-state switch for selectively electrically coupling a positive terminal of said high voltage power source to a first output terminal;

a second solid-state switch for selectively electrically coupling a negative terminal of said high voltage power source to a second output terminal;

a third solid-state switch for selectively electrically coupling said positive terminal of said high voltage power source to said second output terminal;

and a fourth solid-state switch for selectively electrically coupling said negative terminal of said high voltage power source to said first output terminal, wherein each of said solid-state switches is configured to change from an open state to a closed state when a change in a low voltage control signal is sensed.

22. The circuit according to claim 21, further including a switch driver for applying said low voltage control signal to at least one of said first solid-state switch, said second solid-state switch, said third solid-state switch, and said fourth solid-state switch.

23. The circuit according to claim 22, wherein said switch driver applies an identical low voltage control signal to said first solid-state switch and said second solid-state switch.

24. The circuit according to claim 22, wherein said switch driver applies an identical low voltage control signal to said third solid-state switch and said fourth solid-state switch.

25. The circuit according to claim 22, wherein said switch driver provides a first control signal to said first solid-state switch and said second solid-state switch and provides a substantially opposite control signal to said third solid-state switch and said fourth solid-state switch.

26. The circuit according to claim 22, wherein said switch driver provides a first control signal to close two of said first solid-state switch, said second solid-state switch, said third solid-state switch and said fourth solid-state switch, and provides a second control signal to open the other two of said first solid-state switch, said second solid-state switch, said third solid-state switch and said fourth solid-state switch.

27. The circuit according to claim 26, wherein said second control signal is provided before said first control signal is provided.

28. The circuit according to claim 21, wherein each of said solid-state switches includes a control switch and a transistor stack including a plurality of transistors connected in series.

29. The circuit according to claim 28, wherein a first one of said plurality of transistors located at an end of the transistor stack is opened when said control switch changes between an open state and a closed state.

30. The circuit according to claim 29, wherein closing of said first one of said plurality of transistors causes a second one of said plurality of transistors to close, said second transistor being electrically coupled to said first transistor.

31. The circuit according to claim 28, wherein a biasing current passes through an element electrically coupled to a first one of said plurality of transistors when said control switch is in an open state.

32. The circuit according to claim 28, wherein at least one of said plurality of transistors is a FET.

33. The circuit according to claim 32, wherein said FET operates in linear mode.

34. A method for reversing the polarity of a high voltage power source, said method comprising:

applying a low voltage control signal to a first switch to open said first switch, wherein opening said first switch electrically decouples a positive terminal of said high voltage power source from a first output terminal;

applying a low voltage control signal to a second switch to open said second switch, wherein opening said second switch electrically decouples a negative terminal of said power supply from a second output terminal;

applying a low voltage control signal to a third switch to close said third switch, wherein closing said third switch electrically couples said positive terminal to said second output terminal; and applying a low voltage control signal to a fourth switch to close said fourth switch, wherein closing said fourth switch electrically couples said negative terminal to said first output terminal.

35. The method according to claim 34, wherein applying said low voltage control signal to at least one of said first switch, said second switch, said third switch and said fourth switch causes the state of a control switch associated with said at least one switch to change between an open state and a closed state.

36. The method according to claim 34, wherein at least one of said first switch, said second switch, said third switch and said fourth switch includes a plurality of electrically coupled transistors, and further wherein applying said low voltage control signal to said at least one switch causes the state of one of said plurality of transistors to change between an open state and a closed state.

37. The method according to claim 36, wherein closing said one of said plurality of transistors causes at least one of the remaining ones of said plurality of transistors to close.

38. The method according to claim 34, wherein a first low voltage control signal is applied to both said first switch and said second switch.

39. The method according to claim 38, further wherein a second low voltage control signal is applied to said third switch and said fourth switch, and wherein said second low voltage control signal is substantially opposite to said first low voltage control signal.

40. The method according to claim 38, wherein said second low voltage control signal is generated by inverting said first low voltage control signal.

41. The method according to claim 34, wherein a first low voltage control signal is applied to both said third switch and said fourth switch.

42. The method according to claim 34, wherein said first switch and said second switch are opened before said third switch and said fourth switch are closed.

43. The method according to claim 34, further including operating a transistor in one of said first switch and said second switch in linear mode.

44. A method for reversing the polarity of a high voltage power supply, said method comprising:
   disconnecting a positive terminal of said high voltage power supply from a first output terminal by opening a transistor in a first switch having a plurality of transistors;
   disconnecting a negative terminal of said high voltage power source from a second output terminal by opening a transistor in a second switch having a plurality of transistors;
   connecting said positive terminal to said second output terminal by closing a transistor in a third switch having a plurality of transistors; and
   connecting said negative terminal to said first output terminal by closing a transistor in a fourth switch having a plurality of transistors.

45. The method according to claim 44, wherein one of disconnecting said positive terminal and disconnecting said negative terminal includes closing a control switch in one of said first switch and said second switch.

46. The method according to claim 45, wherein closing said control switch causes a current to be supplied to a drain element associated with said opened transistor.

47. The method according to claim 45, wherein closing said one of said first switch and said second switch includes applying a low voltage control signal to said control switch.

48. The method according to claim 47, wherein said low voltage control signal is a high signal.

49. The method according to claim 44, wherein one of disconnecting said positive terminal and disconnecting said negative terminal includes closing a control switch in one of said first switch and said second switch.

50. The method according to claim 49, wherein closing said control switch causes a current to be supplied to a drain element associated with said opened transistor.

51. The method according to claim 49, wherein opening said one of said first switch and said second switch includes applying a low voltage control signal to said control switch.

52. The method according to claim 51, wherein said low voltage control signal is a high signal.

53. The method according to claim 44, wherein one of connecting said positive terminal and connecting said negative terminal includes opening a control switch in one of said third switch and said fourth switch.

54. The method according to claim 53, wherein opening said control switch causes a current to be supplied to a biasing element associated with said closed transistor.

55. The method according to claim 53, wherein opening said one of said third switch and said fourth switch includes applying a low voltage control signal to said control switch.

56. The method according to claim 55, wherein said low voltage control signal is a low signal.

57. The method according to claim 44, wherein one of connecting said positive terminal and connecting said negative terminal includes opening a control switch in one of sad third switch and said fourth switch.

58. The method according to claim 53, wherein opening said control switch causes a biasing current to be applied to a terminal of said closed transistor.

59. The method according to claim 53, wherein closing said one of said third switch and said fourth switch includes applying a low voltage control signal to said control switch.

60. The method according to claim 55, wherein said low voltage control signal is a low signal.

* * * * *

UNITED STATES PATENT AND TRADEMARK OFFICE
CERTIFICATE OF CORRECTION

PATENT NO. : 6,815,845 B1
DATED : November 9, 2004
INVENTOR(S) : Jeffrey David McCallum It is certified that error appears in the above-identified patent and that said Letters Patent is hereby corrected as shown below:

Column 7,
Line 19, ", said" should be -- , and said --;

Column 10,
Line 29, "sad" should be -- said --.

Signed and Sealed this

Nineteenth Day of April, 2005

JON W. DUDAS
*Director of the United States Patent and Trademark Office*